WIDEBAND CRYSTAL-CONTROLLED FM MODULATOR HAVING NOISE CANCELLING FEEDBACK

Filed Aug. 26, 1968

Harrison Y. Miyahira
John L. Wilkerson
INVENTORS

BY [signature]

ATTORNEY

United States Patent Office 3,559,104

Patented Jan. 26, 1971

3,559,104

WIDEBAND CRYSTAL-CONTROLLED FM MODULATOR HAVING NOISE CANCELLING FEEDBACK

Harrison Y. Miyahira and John L. Wilkerson, Torrance, Calif., assignors to TRW Inc., Redondo Beach, Calif., a corporation of Ohio Filed Aug. 26, 1968, Ser. No. 755,063
Int. Cl. H03c 3/08, 3/22
U.S. Cl. 332—19 4 Claims

ABSTRACT OF THE DISCLOSURE

A crystal-controlled oscillator is provided with a feedback path for substantially cancelling any distortion, spurious crystal modes or other noise that may appear in the oscillator output. To this end the feedback path includes an FM demodulator for extracting the baseband signal and any distortion which may exist. The feedback path includes an adder for comparing the input signal with the modulation signal. Preferably, the phases and amplitude of both input and demodulated signal are adjusted to be equal.

BACKGROUND OF THE INVENTION

This invention relates generally to frequency modulation (FM) systems, and particularly relates to a modulation system which makes use of a crystal-controlled oscillator.

It is well known to modulate the frequency of a carrier wave derived from a crystal-controlled oscillator. This is generally effected by impressing the modulation signal on a variable reactance device. In this manner it is possible to cause the oscillator frequency to deviate from its center frequency.

Such conventional systems require that the crystal be used in its fundamental mode of oscillation. In other words, if an overtone crystal mode were used the noise or distortion created thereby would be excessive. That may be readily understood by realizing that the crystal when used in its harmonic mode, may be represented by a plurality of coupled resonant circuits. This, of course, gives rise to a plurality of unwanted frequencies. Accordingly it is generally necessary to suppress spurious resonances of the crystal by 40 to 60 db (decibel) below the amplitude of the oscillatory wave. In addition the frequency deviation capability of the crystal depends on the ratio of the series resonance of the crystal to twice the ratio of the interelectrode capacity to the effective mass capacitance of the crystal.

As a result of these stringent requirements it is conventional practice to hand select from a large number of crystals one which may be used for the particular circuit. There has been no rational procedure developed for eliminating or even reducing such undesired resonances.

It is accordingly, an object of the present invention to provide a frequency modulation system utilizing a crystal-controlled oscillator where the noise or distortion in the output is substantially eliminated including FM noise or phase jitter which may be generated by the oscillator.

A further object of the present invention is to provide a frequency modulation system utilizing a crystal-controlled oscillator where the noise in the output is substantially eliminated even though an overtone crystal is utilized.

Another object of the present invention is to provide a modulation system of the character described where a feedback path which is utilized to minimize noise, is isolated from the modulation input of the crystal oscillator.

SUMMARY OF THE INVENTION

In accordance with the present invention there is provided a wideband crystal-controlled frequency modulation (FM) system. As pointed out before, the system of the invention permits the use of overtone crystals. The system includes a crystal oscillator which in turn, includes a voltage-controllable reactance device for varying the frequency thereof. Such a reactance device may consist, for example, of a varactor. Accordingly a baseband modulation source is coupled to the reactance device for the purpose of modulating the oscillator frequency.

Further, in accordance with the present invention there is provided a feedback loop between the output of the oscillator and its input. This feedback loop includes a frequency demodulator for deriving the baseband modulation signal as well as any noise which may be developed in the oscillator output. This feedback loop serves the purpose to minimize the noise which may otherwise appear in the oscillator output.

Preferably, the feedback loop includes means for adding and substantially equalizing the phases of the signals obtained from the demodulator as well as from the modulation source. Preferably, the amplitudes of these signals are also equalized.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENT

Figure 1:
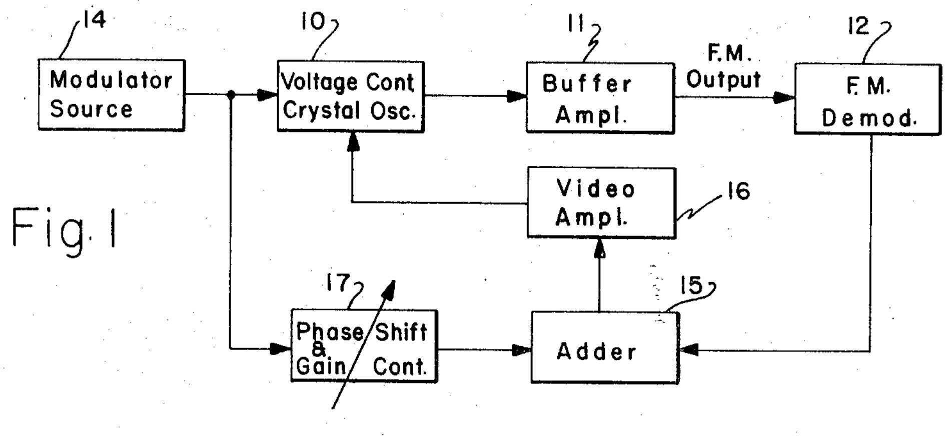
FIG. 1 is a block diagram of an FM modulation system embodying the present invention.

Referring now to the drawing and particularly to FIG. 1, there is illustrated a block diagram of a frequency modulation system in accordance with the present invention. The system of FIG. 1 includes a voltage-controlled crystal oscillator 10. The voltage-controlled crystal oscillator 10 may be conventional. However preferably it takes the form of the oscillator shown in FIG. 3, which will subsequently be explained. The crystal-controlled oscillator 10 is followed by a buffer amplifier 11, which isolates the oscillator 10 from an FM demodulator 12, which follows the buffer amplifier 11. The FM demodulator 12 has the purpose to demodulate the modulated carrier wave developed by the oscillator 10.

The oscillator 10 is modulated by a modulation source 14, which may be a baseband source, that is, it may develop a wideband signal. As is conventional, the crystal oscillator 10 has its frequency varied by means of a voltage-controllable reactance device forming part of the oscillator. Such a reactance device may, for example, consist of a varactor. A varactor is a semiconductor diode of a type where the width of the space-charged region may be varied by applying a reverse voltage thereto. This, in turn, varies the effective capacitance represented by the varactor.

The FM demodulator 12 serves the purpose to recover the baseband modulation signal from the oscillator 10.

It will also demodulate any noise which may be present in the oscillator output.

In accordance with the present invention there is provided a feedback loop between the output and input of the crystal-controlled oscillator 10. This feedback loop includes the FM demodulator 12, followed by an adder 15 and a video amplifier 16, the output of which is fed back into the oscillator 10.

A phase shifter and gain control device 17 is connected between the output of the modulation source 14 and another input of the adder 15 which compares the phases of the signals obtained from the phase shifter 17 and from the FM demodulator 12.

It can now be shown that a feedback of the type shown in FIG. 1 is capable of canceling substantially any noise which may appear in the output of the crystal oscillator 10. This includes not only noise, but also minimizes long-term drift or frequency error. This can be demonstrated by means of the feedback circuit shown schematically in FIG. 2 to which reference is now made.

Figure 2:
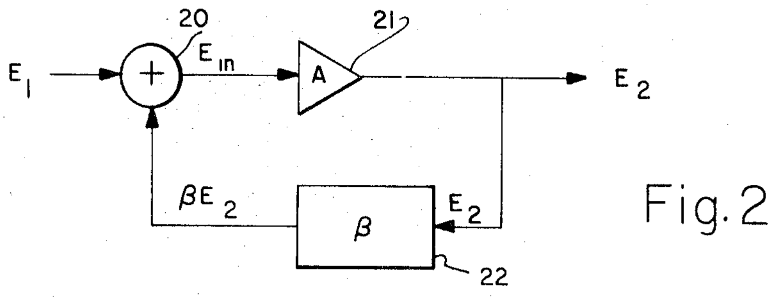
FIG. 2 is an equivalent circuit in block form showing a feedback loop which is utilized in analyzing the operation of the FM system of the invention.

The feedback loop of FIG. 2 includes an input signal $E_1$ which is impressed on a summing network 20 schematically indicated by the (+) sign. Accordingly, the output of the summing network 20 may be termed $E_{in}$ which is impressed on an amplifier 21 having a gain of A as shown. The output signal is impressed on another amplifier 22 having a gain of $\beta$. Accordingly, the output of the amplifier 22 is $\beta E_2$ which is impressed back on the summing network 20. Accordingly, it will be seen that the amplifier 22 is part of the feedback loop.

Setting up the loop equations for the feedback loop of FIG. 2 and assuming that $A\beta$ is large compared to 1, then the following relationship holds:

$$A_{fb}=\frac{1}{\beta} \quad (1)$$

wherein $A_{fb}$ is the feedback closed loop gain, that is, the ratio of the output voltage over the input voltage.

It can now be shown from Equation 1 that if $\beta$ is made large, the noise will be substantially reduced. Thus, if $N_0$ is the output noise, and if we assume that the input signal is the noise, we obtain the following equation:

$$N_0=\frac{1}{\beta}N_{cry} \quad (2)$$

Where $N_{cry}$ is the crystal noise it will be seen that if $\beta$ is $\infty$, the noise now disappears. The same applies to any short-term drift which can also be reduced to zero by again making $\beta$ equal to $\infty$.

The operation of the system of FIG. 1 will now be explained in more detail. Thus the baseband modulation source 14 modulates the frequency of the oscillator 10. The output of the crystal oscillator 10 may be represented by a suitable sine wave. By definition the phase angle of the sine wave may be made equal to zero. This carrier wave now has its frequency modulated by the baseband modulation signal, and a new sine wave is obtained. Among the terms which are included in the equation is the modulation index in radians, which is the frequency deviation of the carrier wave, divided by the modulation frequency.

The buffer amplifier 11 amplifies the modulated carrier wave. Whenever a carrier wave traverses any active circuit element such as an amplifier, a phase delay is produced. Therefore it will be evident that there is a shift of the phase angle of the signal obtained from the amplifier 11. The same, of course, is true of the demodulated signal obtained from the demodulator 12. This demodulated signal is again shifted in phase. At the same time the amplitude of the wave is changed.

An additional phase shift is introduced by the adder 15. Accordingly, the control unit 17 is preferably made adjustable as shown to provide an adjustable phase shift. Accordingly, it is possible to shift the phase of the modulation signal obtained from source 14 and passed through phase shifter 17 to make it equal to the phase of the signal obtained from the demodulator 12. Actually, all that is necessary is to make the phase shift of the signal obtained from the output of demodulator 12 equal to that obtained from phase shifter 17; since the adder 15 adds the two signal voltages, then the two signals should have opposite voltages so that they will cancel.

Simultaneously, the unit 17 is a means for adjusting the gain. This is preferably effected to adjust for an increase or decrease of the amplitude of the wave at certain points of the circuit. For example, oscillator 10 may increase the amplitude of the carrier wave and this amplitude is multiplied by the modulation index previoutly referred to. This factor should be made equal to the amplitude of the wave obtained from the unit 17 multiplied by the original amplitude of the baseband modulation signal. However, it should be understood that it is more important to equalize the phases of the two signals compared by the adder 15 rather than their amplitudes.

As explained above in connection with FIG. 2 the gain $\beta$ should be unity. Accordingly, the gain of the demodulator 12, adder 15 and video amplifier 16 should also be unity. On the other hand, the feedback loop gain does necessarily need to be large.

Figure 3:
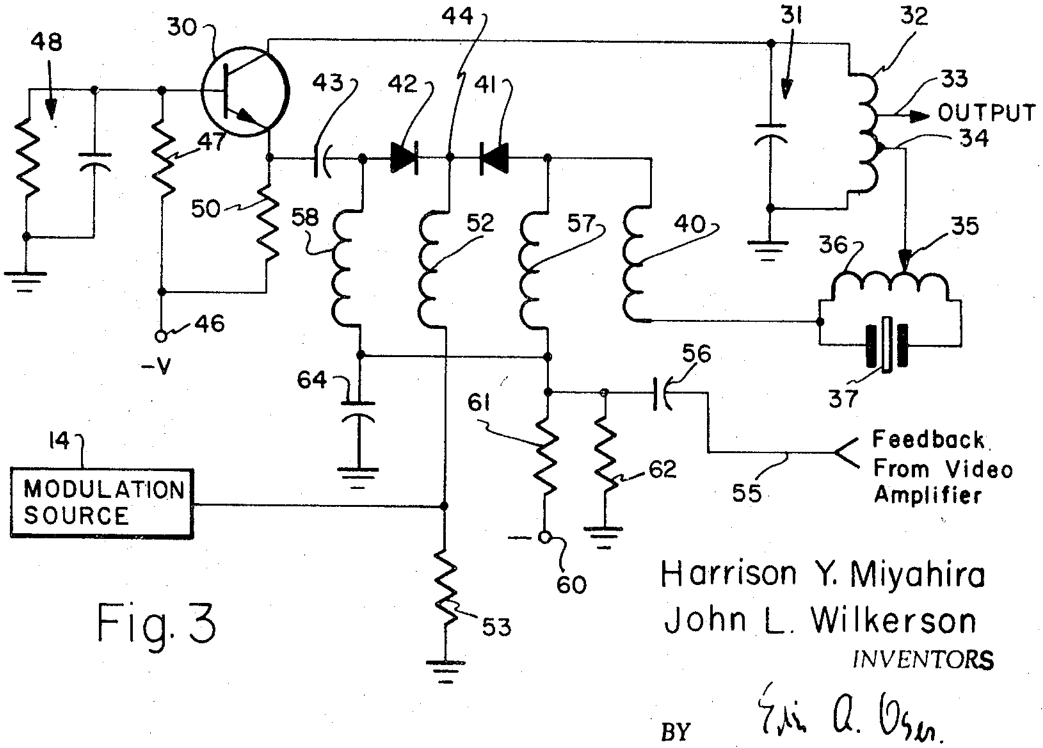
FIG. 3 is a circuit diagram of the crystal oscillator included in the diagram of FIG. 1 and showing its input and output connections.

The circuit of FIG. 3 represents a preferred embodiment of the voltage-controllable crystal oscillator 10 of FIG. 1 with its input and output connections. The circuit of FIG. 3 includes a transistor 30 which may be an n-p-n transistor as shown. The transistor 30 is part of the crystal-controlled oscillator and includes a parallel resonant circuit 31 coupled between the collector of the transistor and ground. The resonant circuit 31 includes an inductor 32 having a center tap 33 from which the modulated output wave may be derived. Another tap 34 on transistor 32 is connected to a variable tap 35 on an inductor 36 connected across a piezoelectric crystal 37. The crystal is made to resonate at a desired frequency by means of the inductor 36.

The feedback loop is completed by an inductor 40 connected to the crystal 37, a pair of varactors 41 and 42 and a blocking capacitor 43 connected to the emitter of the transistor 30. The varactors 41 and 42 are connected back to back, that is, a junction point 44 connects the cathodes thereof.

A negative voltage V is applied to the terminal 46. This in turn is applied to the base of transistor 30 through a resistor 47. A resistance-capacitance bias network 48 is also connected between the base of transistor 30 and ground. The negative voltage from terminal 46 is applied to the emitter of transistor 30 through a voltage dropping resistor 50.

The modulation signal from the modulation source 14 is applied through choke 52 to the junction point 44 of the two varactors 41, 42. The modulation signal is developed across resistor 53, which is connected between the source 14 and ground.

The feedback signal from the video amplifier 16 is obtained from lead 55. This is applied through coupling capacitor 56 and two chokes 57 and 58 respectively, to the other two terminals of the two varactors 41 and 42, that is, to their anodes. The two varactors 41 and 42 are biased by the negative voltage obtained from terminal 60 and applied through a voltage divider network 61 and 62 connected between the terminal 60 and ground. The junction point of the two resistors 61, 62 is connected to one terminal of the two chokes 57 and 58 and hence to the anodes of the two varactors 41 and 42. A blocking and bypass capacitor 64 is connected between the junction point of resistors 61, 62 and ground. It serves the purpose to bypass the carrier wave to ground.

The crystal-controlled oscillator of FIG. 3 operates in a conventional manner. It should be noted that the variable tap 35 permits to adjust the coupling between the crystal 37 and the feedback circuit. It will be appreciated that if the coupling is tight, that is, if the circuit 36, 37 is entirely in the feedback loop, it is more difficult to deviate the frequency of the oscillator. On the other hand, if the coupling is made looser, a larger frequency deviation may be obtained. Furthermore the modulation signal is injected into the junction point 44 of the two varactors. The feedback signal is applied to the other two terminals of the varactors. Accordingly the feedback is isolated from the modulation input.

The voltage of the terminal 60 applied to the two varactors serves the purpose to bias the two varactors to their proper operating level.

It will be understood that the circuit specifications of the voltage-controlled crystal oscillator of FIG. 3 may vary according to design for any particular application. The following circuit specifications are included, by way of example only, as suitable for an output frequency of 50 mHz.

transistor 30—type 2N918
varactor 41, 42—type PC116
crystal 37—cut to series resonate at 50 mHz., 5th overtone
inductor 40—2 microhenry
inductor 57—12 microhenry
inductor 52—12 microhenry
inductor 58—12 microhenry
capacitor 56—0.1 microfarad
capacitor 64—1000 picofarad
capacitor 43—130 picofarad
the capacitor of network 48—2200 picofarad
the resistor of network 48—91,000 ohms
resistor 47—1200 ohms
resistor 50—200 ohms
resistor 53—20,000 ohms
resistor 61—47,000 ohms
resistor 62—47,000 ohms As mentioned above, the modulator system of the invention makes it possible to utilize the crystal 37 not only in its fundamental mode, but also in a harmonic mode. All that is necessary is that the frequency deviation as defined by the ratio of the series resonance of the crystal divided by two times the ratio of the interelectrode capacitance to the effective mass or stiffness capacitance of the crystal is satisfied. The spurious response need not be suppressed by more than 6 db, rather than the conventional requirements of suppressing it to below 40 to 60 db's.

Since the system of FIG. 1 will suppress substantially any noise it also reduces the FM noise content, sometimes called phase jitter. This is created by the so-called Gaussian noise. It is, of course, well known that a feedback loop does reduce such noise as phase jitter. At the same time, the linearity is improved by the use of the feedback loop. Accordingly, the deviation from linearity may be about 0.5% or better.

Finally, as explained in connection with FIG. 3, the feedback is substantially isolated from the modulation input by the particular connection of the two circuits. The manner in which the feedback voltage is applied also accomplishes phase reversal.

What is claimed is:

1. A wideband crystal-controlled frequency-modulation system permitting overtone crystal modes comprising:
(a) a crystal oscillator;
(b) a voltage-controllable reactance device included in said crystal oscillator for varying the frequency thereof;
(c) a baseband modulation source coupled to said reactance device for modulating the frequency of said oscillator;
(d) a feedback loop connected between the output of said oscillator and an input thereof, said feedbock loop including:
(e) a frequency demodulator for demodulating the oscillator output wave;
(f) an adder coupled to said frequency demodulator, said adder being coupled to said crystal oscillator; and
(g) a variable phase shifter and amplitude control coupled between said modulation source and said adder for matching and comparing the phase of the baseband signals obtained from said modulation source with that of the signals derived from said frequency demodulator, whereby noise which may appear at the output of said oscillator is substantially cancelled.

2. A modulation system as defined in claim 1 wherein said frequency demodulator, said adder and said variable phase shifter and amplitude shift control have a gain of substantially unity.

3. A modulation system as defined in claim 1 wherein said feedback loop includes a video amplifier connected between said variable phase shifter and amplitude control and said crystal oscillator.

4. A wideband crystal controlled frequency modulation system permitting the use of overtone crystals comprising:
(a) a crystal oscillator;
(b) a voltage-controllable reactance device included in said crystal oscillator for varying the frequency thereof;
(c) a baseband modulation source coupled to said reactance device for modulating said oscillator frequency;
(d) a frequency demodulator coupled to the output of said oscillator for deriving a demodulated baseband modulation signal as well as any noise which may be present;
(e) a feedback loop including said frequency demodulator and connected to the input of said crystal oscillator;
(f) said feedback loop further including a video amplifier connected between said frequency demodulator and the input of said crystal oscillator; and
(g) a variable phase shifter and amplitude control coupled between said modulation source and said video amplifier for substantially matching the phase of and cancelling the demodulated modulation signal with the signal from said modulation source, whereby noise which may appear at the output of said oscillator is also substantially cancelled.

References Cited

UNITED STATES PATENTS

| | | | |
|---|---|---|---|
| 2,501,368 | 3/1950 | White | 325—148 |
| 2,662,214 | 12/1953 | Hugenholtz | 332—19 |
| 2,768,293 | 10/1956 | Van Hofweegen | 332—19X |
| 2,925,561 | 2/1960 | MacDonald | 332—26 |
| 2,925,563 | 2/1960 | Firestone | 332—26 |
| 3,048,796 | 8/1962 | Snow et al. | 332—19 |
| 3,050,693 | 8/1962 | Sinninger | 332—30(V)X |
| 3,068,427 | 12/1962 | Weinberg | 332—26X |
| 3,199,028 | 8/1965 | McLin et al. | 332—19X |

ALFRED L. BRODY, Primary Examiner

U.S. Cl. X.R.

325—147; 331—36; 332—26, 30